(12) United States Patent
Nakasato et al.

(10) Patent No.: US 7,969,005 B2
(45) Date of Patent: Jun. 28, 2011

(54) PACKAGING BOARD, REWIRING, ROUGHENED CONDUCTOR FOR SEMICONDUCTOR MODULE OF A PORTABLE DEVICE, AND MANUFACTURING METHOD THEREFOR

(75) Inventors: Mayumi Nakasato, Ogaki (JP); Hideki Mizuhara, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 2 days.

(21) Appl. No.: 12/109,811

(22) Filed: Apr. 25, 2008

(65) Prior Publication Data
US 2008/0272502 A1    Nov. 6, 2008

(30) Foreign Application Priority Data

Apr. 27, 2007  (JP) ................................. 2007-119388
Apr. 7, 2008   (JP) ................................. 2008-099483

(51) Int. Cl.
*H01L 23/48* (2006.01)
*H01L 23/52* (2006.01)
*H01L 29/40* (2006.01)

(52) U.S. Cl. ......... 257/738; 257/737; 257/773; 257/786

(58) Field of Classification Search .................. 257/738, 257/773, 786; 29/459; 361/719, 760
See application file for complete search history.

(56) References Cited

U.S. PATENT DOCUMENTS

| | | | | |
|---|---|---|---|---|
| 5,725,940 A * | 3/1998 | Sakai et al. | ............... | 428/318.6 |
| 6,534,723 B1 * | 3/2003 | Asai et al. | ................ | 174/255 |
| 6,946,205 B2 * | 9/2005 | Higashitani | ................ | 428/615 |
| 7,071,424 B1 * | 7/2006 | Shirai et al. | .................. | 174/263 |
| 7,341,888 B2 * | 3/2008 | Nam et al. | .................... | 438/106 |
| 2001/0005545 A1 * | 6/2001 | Andou et al. | ................. | 428/209 |
| 2002/0162687 A1 * | 11/2002 | Akihiko | ........................ | 174/262 |
| 2003/0180512 A1 * | 9/2003 | Andou et al. | ................ | 428/209 |
| 2004/0134682 A1 * | 7/2004 | En et al. | ........................ | 174/258 |
| 2004/0238209 A1 * | 12/2004 | Yuri et al. | ..................... | 174/257 |
| 2006/0012967 A1 * | 1/2006 | Asai et al. | ..................... | 361/764 |
| 2006/0054350 A1 * | 3/2006 | Sugawa et al. | ............... | 174/255 |
| 2006/0244149 A1 * | 11/2006 | Nakamura et al. | ............ | 257/773 |
| 2007/0096327 A1 * | 5/2007 | Kawamura et al. | .......... | 257/774 |
| 2008/0079151 A1 * | 4/2008 | Okayama | ..................... | 257/737 |
| 2009/0015104 A1 * | 1/2009 | Kimura et al. | ................ | 310/334 |
| 2009/0025966 A1 * | 1/2009 | Shimoosako et al. | ........ | 174/256 |
| 2009/0133910 A1 * | 5/2009 | Ohashi et al. | ................ | 174/258 |
| 2009/0178828 A1 * | 7/2009 | Tsumura et al. | .............. | 174/252 |
| 2009/0238956 A1 * | 9/2009 | Kojima | ......................... | 427/98.5 |

FOREIGN PATENT DOCUMENTS

| | | | |
|---|---|---|---|
| JP | 2003110227 A | * | 4/2003 |
| JP | 2004152869 A | * | 5/2004 |
| JP | 2005-286041 | | 10/2005 |

\* cited by examiner

*Primary Examiner* — Teresa M Arroyo
(74) *Attorney, Agent, or Firm* — McDermott Will & Emery LLP

(57) ABSTRACT

A method for manufacturing a semiconductor module includes: a first process of forming a conductor on one face of an insulating layer; a second process of exposing the conductor from the other face of the insulating layer; a third process of providing a first wiring layer on an exposed area of the conductor and on the other face of the insulating layer; a fourth process of preparing a substrate on which a circuit element is formed, the second wiring being formed on the substrate; and a fifth process of embedding the conductor in the insulating layer by press-bonding the insulating layer and the substrate in a state where the conductor on which the first wiring layer is provided by the third process is disposed counter to the second wiring layer. Wiring is formed without causing damaging to the circuit element.

2 Claims, 11 Drawing Sheets

PACKAGING BOARD, REWIRING, ROUGHENED CONDUCTOR FOR SEMICONDUCTOR MODULE OF A PORTABLE DEVICE, AND MANUFACTURING METHOD THEREFOR

CROSS-REFERENCE TO RELATED APPLICATIONS

This application is based upon and claims the benefit of priority from the prior Japanese Patent Application No. 2007-119388, filed on Apr. 27, 2007, and Japanese Patent Application No. 2008-099483, filed on Apr. 7, 2008, the entire contents of which are incorporated herein by reference.

BACKGROUND OF THE INVENTION

1. Field of the Invention

The present invention relates to a packaging board and a manufacturing method therefor, a semiconductor module and a manufacturing method therefor, and a portable device.

2. Description of the Related Art

In recent years, along with the on-going downsizing and functional sophistication of electronic devices, there has been an ever-growing demand for smaller circuit devices to be incorporated into electronic devices. One of known ways to meet such a demand is to narrow the pitch of external connection electrodes of a circuit device. But because of the size of solder bumps themselves used as the electrodes and the formation of bridges at soldering, there has existed a limit to the downsizing by narrowing the pitch of the external connection electrodes of a circuit device. For further downsizing of a circuit device, therefore, there is a technology conceived for rearrangement of external connection electrodes by forming a rewiring for a circuit device.

In general, when the rewiring is formed in the circuit device, an opening by which to provide a via contact for an insulating layer on an electrode pad is formed in order to retrieve externally a signal sent from a circuit element within the circuit device via the electrode pad. In the conventional practice, a method is conceived where the formation of such an opening is done by laser irradiation. However, since the circuit element is placed below the electrode pad, it is desired that such an opening be formed without being exposed to high temperature as much as possible. As one of known methods to resolve this problem is a method for manufacturing a semiconductor device by the laser irradiation followed by dry etching.

Nevertheless, in the above-described method, the electrode pad exposed at the final stage in the dry etching is exposed to plasma atmosphere while the effect of heat by the laser irradiation can be suppressed. As a result, the circuit elements, such as transistors, which are connected to the electrode pad may possibly be charged up. Accordingly, the device performance deteriorates due to the charge-up phenomenon and therefore the reliability of circuit elements drops.

SUMMARY OF THE INVENTION

In order to solve the foregoing problems, a method, for manufacturing a semiconductor module, according to the method includes: a first process of forming a conductor on one face of an insulating layer; a second process of exposing the conductor from the other face of the insulating layer; a third process of providing a first wiring layer on an exposed area of the conductor and on the other face of the insulating layer; a fourth process of preparing a substrate on which a circuit element is formed wherein a second wiring is formed on the substrate; and a fifth process of embedding the conductor in the insulating layer by press-bonding the insulating layer and the substrate in a state where the conductor on which the first wiring layer is provided by the third process is disposed counter to the second wiring layer.

By employing this embodiment, the conductor is exposed from the other face of the insulating layer before the insulating layer is press-bonded to the substrate on which a circuit element is formed. This process does not give damage to the circuit element. Also, by employing this method, the conductor is formed on one face of the insulating layer and, at the same time, is exposed from the other face of the insulating layer. And the first wiring layer is provided in a position where the conducive is exposed, and the first wiring layer is also provided on the face of the insulating layer. Accordingly, the conductor is firmly fixed to the insulating layer via the first wiring layer. As a result, when the conductor is embedded in the insulating layer by press-bonding the insulating layer and the substrate in a state where the conductor and the second wiring layer are disposed counter to each other, the conductor is less likely to be displaced.

Another embodiment of the present invention relates also to a method for manufacturing a semiconductor module. This method includes: a first process of forming a conductor on one of faces of an insulating layer which contains fibrous filler material whose coefficient of thermal expansion is small than that of the insulating layer, wherein the fibrous filler material is arranged so that a direction of fibers thereof intersects with a thickness direction of the insulating layer; a second process of exposing the conductor from the other face of the insulating layer; a third process of providing a first wiring layer on an exposed area of the conductor and on the other face of the insulating layer; a fourth process of preparing a substrate on which a circuit element is formed wherein a second wiring is formed on the substrate; and a fifth process of embedding the conductor in the insulating layer by press-bonding the insulating layer and the substrate in a state where the conductor on which the first wiring layer is provided by the third process is disposed counter to the second wiring layer.

By employing this embodiment, the conductor is exposed from the other face of the insulating layer before the insulating layer is press-bonded to the substrate on which a circuit element is formed. This process does not give damage to the circuit element. Also, by employing this method, the conductor is formed on one face of the insulating layer and, at the same time, is exposed from the other face of the insulating layer. And the first wiring layer is provided in a position where the conducive is exposed, and the first wiring layer is also provided on the face of the insulating layer. Accordingly, the conductor is firmly fixed to the insulating layer via the first wiring layer. As a result, when the conductor is embedded in the insulating layer by press-bonding the insulating layer and the substrate in a state where the conductor and the second wiring layer are disposed counter to each other, the conductor is less likely to be displaced. Also, according to this embodiment, the fibrous filler material whose coefficient of thermal expansion is smaller than that of the insulating layer is contained in the insulating layer. Thus, the deformation of the insulating layer caused when the thermal stress is applied to the semiconductor module can be restricted. The fibrous filler material is curved toward the first wiring layer by the conductor penetrating through the insulating layer. As a result, its restorative force works to press the conductor against the second wiring layer to achieve adhesion therebetween.

Still another embodiment of the present invention relates to a method for manufacturing a packaging board. This method includes: a first process of forming a conductor on one of faces of an insulating layer; a second process of exposing the conductor from the other face of the insulating layer; and a third process of providing a wiring layer on an exposed area of the conductor and on the other face of the insulating layer. A means for roughening an exposed face of the conductor is used in the second process. By employing this embodiment, the adhesion between the conductor and the wiring layer improves.

Still another embodiment of the present invention relates to a packaging board. This packaging board comprises: an insulating layer; a conductor formed on one of faces of the insulating layer; and a wiring layer provided on the other face of the insulating layer and a penetration portion penetrating to the conductor from the other face thereof. An arithmetic mean roughness Ra of the exposed face of the conductor in contact with the wiring layer is 2 to 50 µm. By employing this embodiment, the adhesion between the conductor and the wiring layer improves.

Still another embodiment of the present invention relates to a semiconductor module. This semiconductor module comprises: an insulating layer; a first wiring layer provided on the insulating layer; a substrate on which a circuit element is formed; a second wiring layer formed on a face of the substrate; and a conductor, embedded in the insulating layer, which electrically connects the first wiring layer to the second layer. The conductor is such that an arithmetic mean roughness Ra of a face thereof in contact with the first wiring layer is 2 to 50 µm.

By employing this embodiment, the adhesion between the conductor and the first wiring layer improves. If the arithmetic mean roughness Ra of the face in contact therewith is small, the adhesion between the conductor and the first wiring layer will not be enough. If the arithmetic mean roughness Ra is too high, a plated layer will grow abnormally and the concentration of electric field will occur when the first wiring layer is formed on an exposed area of the conductor by the plating. This may cause faulty conduction.

Still another embodiment of the present invention relates also to a semiconductor module. This semiconductor module comprises: an insulating layer which contains fibrous filler material whose coefficient of thermal expansion is smaller than that of the insulating layer, the fibrous filler material being arranged so that a direction of fibers thereof intersects with a thickness direction of the insulating layer; a first wiring layer provided on the insulating layer; a substrate on which a circuit element is formed; a second wiring layer formed on a face of the substrate; and a conductor, embedded in the insulating layer, which electrically connects the first wiring layer to the second layer. The fibrous filler material has a smaller coefficient of thermal expansion than that of the insulating layer, and the filler material is curved toward the first insulating layer in the vicinity of the conductor; and the conductor is such that an arithmetic mean roughness Ra of a face thereof in contact with the first wiring layer is 2 to 50 µm.

By employing this embodiment, the adhesion between the conductor and the first wiring layer improves. Also, according to this embodiment, the fibrous filler material whose coefficient of thermal expansion is smaller than that of the insulating layer is contained in the insulating layer. Thus, the deformation of the insulating layer caused when the thermal stress is applied to the semiconductor module can be suppressed. The fibrous filler material is curved toward the first wiring layer by the conductor penetrating through the insulating layer. As a result, its restorative force works to press the conductor against the second wiring layer to achieve adhesion therebetween.

Still another embodiment of the present invention relates to a portable device. This portable device mounts a semiconductor module according to any one of the above-described embodiments.

It is to be noted that any arbitrary combinations or rearrangement, as appropriate, of the aforementioned constituting elements and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

Figure 1:
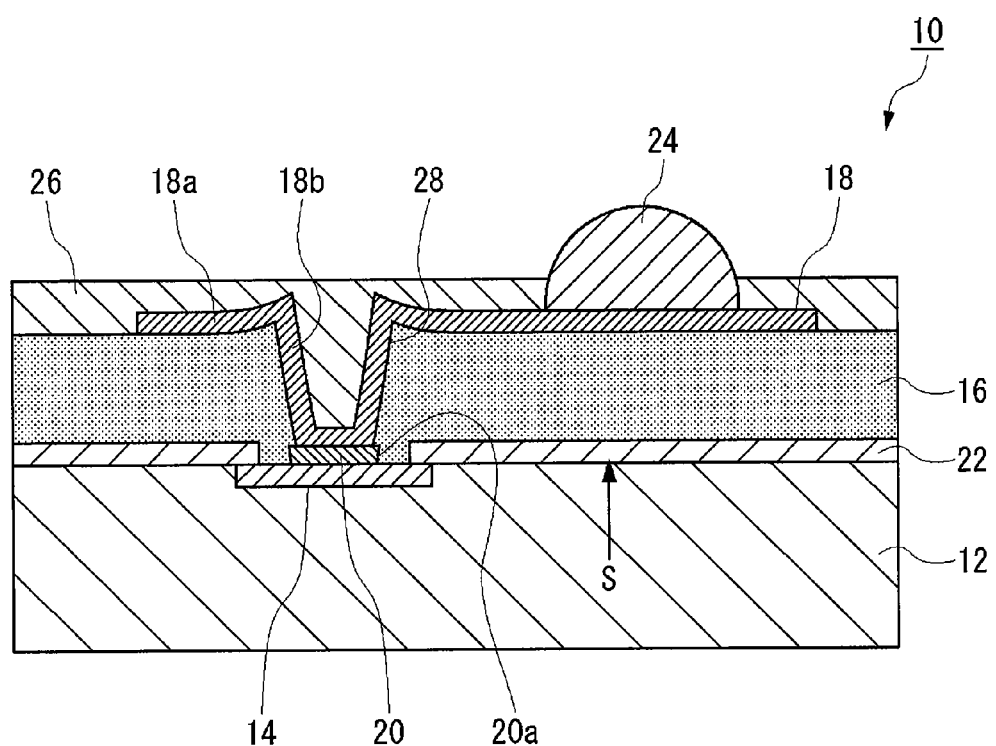
FIG. 1 is a schematic cross-sectional view illustrating a structure of a semiconductor module according to a first embodiment of the present invention.

The invention will now be described by reference to the preferred embodiments. This does not intend to limit the scope of the present invention, but to exemplify the invention.

The embodiments will now be described with reference to drawings. Note that in all of the Figures the same components are given the same reference numerals and the repeated description thereof is omitted as appropriate.

First Embodiment

Structure of a Semiconductor Module

FIG. 1 is a schematic cross-sectional view illustrating a structure of a semiconductor module according to a first embodiment of the present invention. As shown in FIG. 1, a semiconductor module 10 according to the first embodiment includes a semiconductor substrate 12 with a predetermined electric circuit or a circuit element such as MOSFET (not shown) formed by a known technique on a surface S (upper-face side) thereof, an electrode 14 of the circuit element, which is part of a second wiring layer formed on the surface S (especially in the peripheral part) serving as a mounting face of the semiconductor substrate 12, an insulating layer 16 disposed on the electrode 14, a first wiring layer 18 disposed on the insulating layer 16, and a conductive bump 20 which serves as a conductor electrically connecting the electrode 14 to the first wiring layer 18 in a state where it is embedded with the insulating layer 16.

Formed on the face of the semiconductor substrate 12 is a protective film 22 in such a manner that it has a predetermined region exposing the electrode 14. To widen the pitch of adjacent electrodes 14, a rewiring pattern 18a is formed on the insulating layer 16 which is provided on the top of the electrode 14 and the protective film 22. Connection between the electrode 14 and the rewiring pattern 18a is made via the conductive bump 20 in contact with the exposed surface of the electrode 14 and a via contact 18b connected to this conductive bump 20. Provided on a predetermined region of the rewiring pattern 18a is a solder bump 24, which serves as an external connection electrode, and the rewiring pattern 18a is covered by a solder resist layer 26 except in the region where the solder bump 24 is provided.

More specifically, the insulating layer 16 is disposed above the surface S of the semiconductor substrate 12, and the thickness thereof is, for instance, about 80 μm. The insulating layer 16 is formed of B-stage resin. It is desirable that a thermosetting resin, such as polyimide resin, epoxy resin, phenol resin and BT resin, be a material used for the insulating layer 16. Alternatively, the insulating layer 16 may be formed of a material that develops plastic flow under pressure. An epoxy thermosetting resin is one example of the material that develops plastic flow under pressure. The epoxy thermosetting resin to form the insulating layer 16 is more preferably a material that has a viscosity of about 1 kPa·s at a temperature of 160° C. and a pressure of 8 MPa. When placed under a pressure of 15 MPa at a temperature of 160° C., the viscosity of this resin material drops to about ⅛ of that without the pressurization.

The resin may be a type of film in which woven glass fiber is impregnated with resin. Or the insulating layer 16 may be a film added with a filler of about 2 to 10 μm diameter. The filler material is preferably alumina ($Al_2O_3$), silica ($SiO_2$), aluminum nitride (AlN), silicon nitride (SiN), boron nitride (BN) or the like. The filling rate of the filler in weight is preferably about 30 to 80%. The conductive bump 20 may be made of a metal such as copper (Cu) or aluminum (Al).

The height of the conductive bump 20 is, for instance, about 10 μm. The conductive bump 20 according to the first embodiment, which is disposed as a circular truncated cone (trapezoidal in cross section), has a tip end, which is in parallel with the contact face of the electrode 14, and a side face part 20a, which is formed increasingly smaller in diameter (size) closer to the tip end. That is, the conductive bump 20 has a side face part 20a formed at an obtuse angle with the face in contact with the surface S of the semiconductor substrate 12. In other words, the conductive bump 20 is formed in such a manner that the area of cross section in parallel with the surface S of the semiconductor substrate 12 increases as it approaches the first wiring layer 18 from the electrode 14. The diameter of the tip end of the conductive bump 20 and the diameter of the face in contact with the first wiring layer 18 are about 80 μmφ and about 100 μmφ, respectively. The conductive bump 20 is disposed in a position corresponding to the electrode 14. And the tip end of the conductive bump 20 is so formed that it comes in direct contact with the electrode 14. Note that the height of the conductive bump 20 may be selected from the range of about 5 to 20 μm.

The rewiring pattern 18a is formed on the insulating layer 16, and the thickness thereof is, for instance, about 20 μm. The rewiring pattern 18a, which is formed of a metal such as copper (Cu), is electrically connected to the conductive bump 20 via the via contact 18b, which is disposed within an opening 28 in the insulating layer 16. Here, the width of the opening 28 is about 100 μm. The via contact 18b is disposed in such a manner as to cover the inner surface of the opening 28, and is formed integrally with the rewiring pattern 18a. It is to be noted that because of the presence of the conductive bump 20 on the electrode 14, the depth of the via contact 18b (opening 28) is about 70 μm, which can be shallower than when the via contact (opening) is formed directly on the electrode 14.

As described above, the semiconductor module 10 according to the present embodiment has the rewiring pattern 18a formed to be coupled with the electrode 14 formed on the surface S of the semiconductor substrate 12 via the conductive bump 20 and the via contact 18b, so that rearrangement of the solder bump 24, which is an external connection electrode, can be effected.

(Manufacturing Method of Semiconductor Module)

Figure 2A:
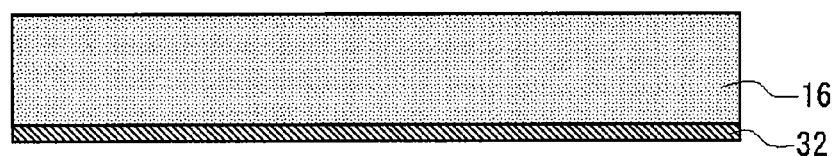
FIGS. 2A to 2C are schematic cross-sectional views for explaining a first process in a method for manufacturing a semiconductor module according to a first embodiment of the present invention.
Figure 2B:
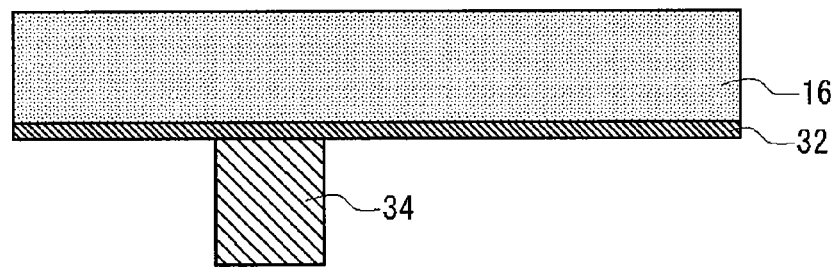
Figure 2C:
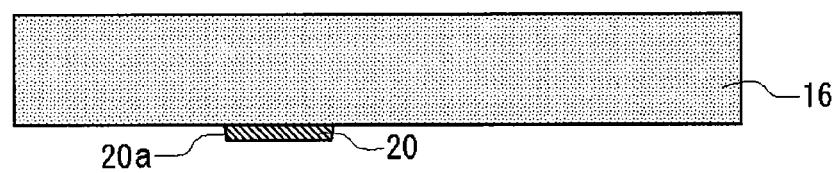
Figure 3A:
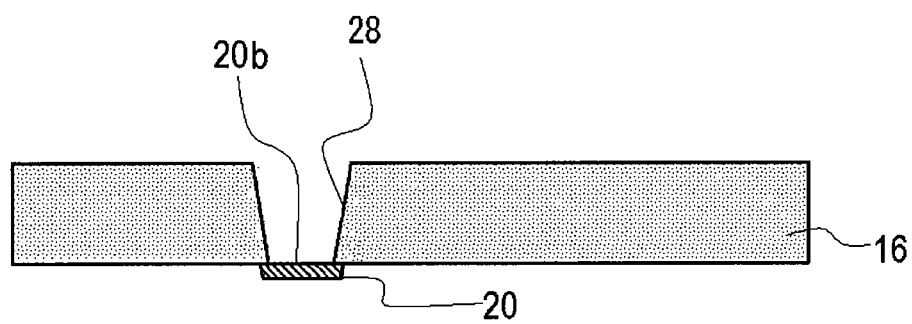
FIGS. 3A and 3B are schematic cross-sectional views for explaining a second process and a third process in a method for manufacturing a semiconductor module according to a first embodiment of the present invention.
Figure 3B:
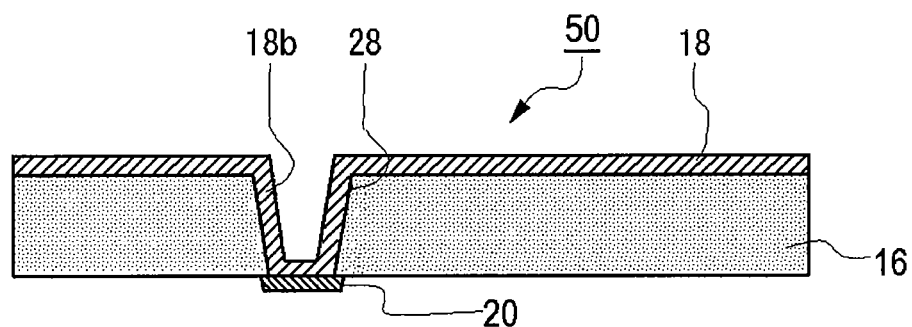
Figure 4A:
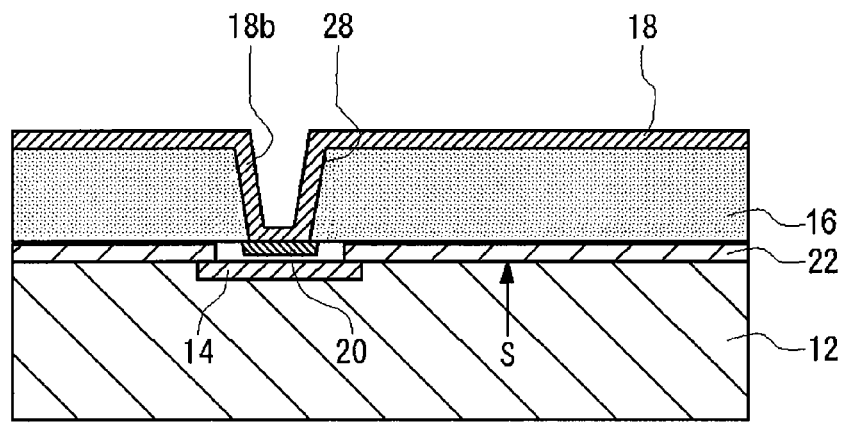
FIGS. 4A and 4B are schematic cross-sectional views for explaining a fourth process and a fifth process in a method for manufacturing a semiconductor module according to a first embodiment of the present invention.
Figure 4B:
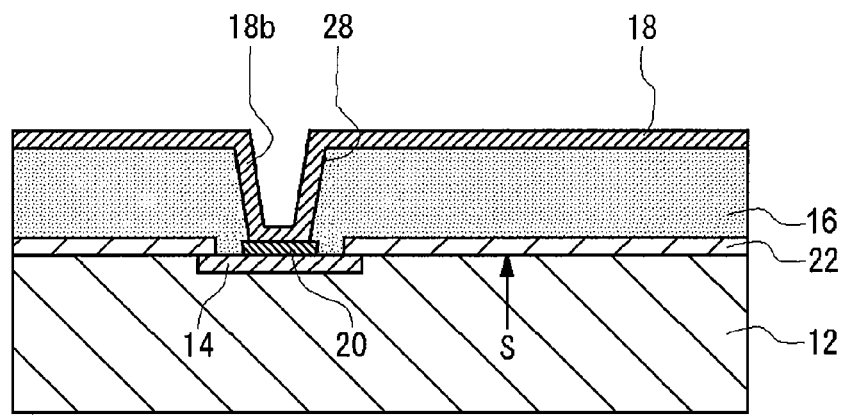

Now, referring to FIGS. 2A to 4B, a method for manufacturing a semiconductor module according to the first embodiment will be described. FIGS. 2A to 2C are schematic cross-sectional views for explaining a first process in the method for manufacturing a semiconductor module according to the first embodiment. FIGS. 3A and 3B are schematic cross-sectional views for explaining a second process and a third process in the method for manufacturing a semiconductor module according to the first embodiment. FIGS. 4A and 4B are schematic cross-sectional views for explaining a fourth process and a fifth process in the method for manufacturing a semiconductor module according to the first embodiment.

First, as shown in FIG. 2A, a copper layer 32 of about 10 μm thickness is formed on one face of an insulating layer 16 of about 80 μm thickness, which is made of an epoxy thermosetting resin, using an electroless plating and an electrolytic plating. Next, as shown in FIG. 2B, a resist mask 34 is formed in a conductive bump forming area on the copper layer 32, using an ordinary lithography method. Here, the conductive bump forming area corresponds to the position of the electrode 14 of the semiconductor substrate 12 shown in FIG. 1.

Now, as shown in FIG. 2C, a conductive bump 20 having a predetermined circular truncated cone shape is formed by a wet etching process using a chemical and the resist mask 34 as the mask, and then the resist mask 34 is removed. At this time, the conductive bump 20 is so formed as to have a side face part 20a, which is increasingly smaller in diameter (size) closer to the tip end. That is, the conductive bump 20 has a side face part 20a formed at an acute angle with the face in contact with the surface of the insulating layer 16. In other words, the conductive bump 20 is formed in such a manner that the area of cross section parallel to the surface of the insulating layer 16 decreases in the direction perpendicular to the surface of the insulating layer 16. Thus, by the first process according to the first embodiment as illustrated in FIGS. 2A to 2C, the conductive bump 20 can be formed on one face of the insulating layer 16.

In the manufacturing method of a semiconductor module 10 according to the first embodiment, the height of the conductive bump 20 is about 10 μm, the diameter of the tip end of the conductive bump 20 is about 80 μmφ, and the diameter of the face at which the conductive bump 20 is in contact with the insulating layer 16 is about 100 μmφ. In each step of the above-described process, care is exercised not to heat to the thermosetting temperature so that the insulating layer 16, which is made of an epoxy thermosetting resin, is maintained in a half-cured (fluid) state without being completely thermally-cured.

Next, a description will be given of the second process, in which the conductive bump 20 is exposed from the other face of the insulating layer 16, and the third process, in which a first wiring layer 18 is formed on the exposed portion of the conductive bump 20 and on the other face of insulating layer 16.

As shown in FIG. 3A, an opening 28 is formed by laser irradiation from above the insulating layer 16 in a manner such that the conductive bump 20 is exposed. That is, the opening 28 is a penetration portion that penetrates to the conductive bump 20 from the top face of the insulating layer 16. The laser irradiation here may use carbon dioxide gas laser, for instance. The laser irradiation is performed in two stages. One stage uses first irradiation conditions where relevant part of the insulating layer 16 is removed to an arbitrary depth by a beam whose energy density is high. The other stage uses second irradiation conditions where the shape of a via side wall is adjusted by a beam whose energy density is low. To be more precise, the power at processing point may be 1.0 to 5.0 W and the pulse number may be 5 to 50 as the first irradiation conditions. As the second irradiation conditions, the power at processing point may be 0.1 to 0.5 W, the pulse number may be 1, the beam diameter may be 10 to 30 μm, the shift amount may be 5 to 20 μm, and the pitch may be 1 to 10 μm. Thereby, the opening 28 having a tapered side wall whose diameter decreases as it approaches the conductive bump 20 from the surface of the insulating layer 16 can be formed.

In the above-described first process, the conductive bump 20 is formed in such a manner that the area of cross section parallel to the surface of the insulating layer 16 decreases in the direction perpendicular to the surface of the insulating layer 16. Therefore, the conductive bump 20, which is embedded in the insulating layer 16 in the third process described later, has a larger area of the portion thereof facing the upper face of the insulating layer 16 than the area of the face thereof in contact with the electrode 14. As a result, the conductive bump 20 is exposed from the other face of the insulating layer 16, which makes positioning easier for via formation with laser to expose the conductive bump 20 from the other face of the insulating layer 16. Hence, the manufacturing cost can be reduced. Thus, by the second process (exposing process) according to the first embodiment as illustrated in FIG. 3A, the conductive bump 20 can be exposed from the other face of the insulating layer 16.

Figure 5:
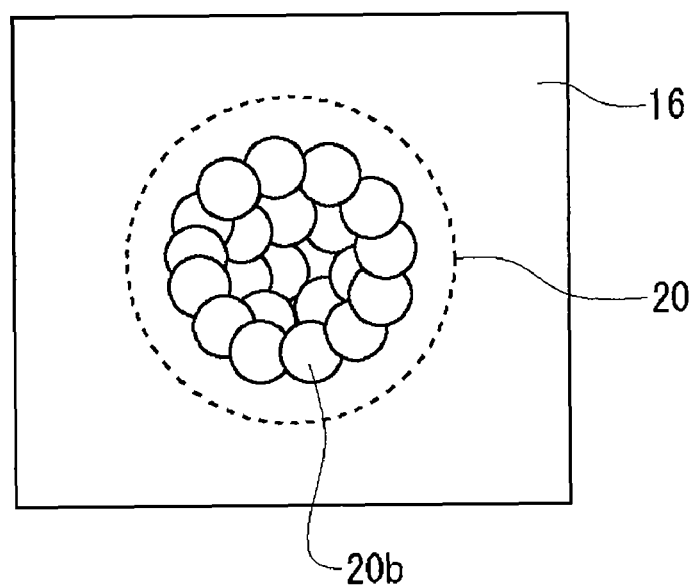
FIG. 5 is a top view showing that a conductive bump is exposed from the other face of a insulating layer by laser irradiation.

In the second process according to the first embodiment, the exposing face of the conductive bump 20 is subjected to roughening when the conductive bump 20 is to be exposed from the other face of the insulating layer 16. FIG. 5 is a top view showing that the conductive bump is exposed from the other face of the insulating layer by laser irradiation.

In the first embodiment, laser is used as a means for roughening the surface of the conductive bump 20, and the opening 28 serving as a via hole having larger diameter than the spot diameter of the laser beam is formed from the other face of the insulating layer 16 by the use of a plurality of laser irradiations and, at the same time, an exposed face 20b of the conductive bump 20 is roughened. Thereby, the formation of a via hole and the roughening processing of the exposed face 20b of the conductive bump 20 can be done in the same process. Hence, the manufacturing cost can be reduced.

Next, as shown in FIG. 3B, a plating of copper in the thickness of about 20 μm is performed on the upper face of the insulating layer 16 and on the inner face of the opening 28 including a position where the conductive bump 20 is exposed, using an electroless plating and an electrolytic plating, as the third process. As a result, a first wiring layer 18 comprised of a copper plating layer having a thickness of about 20 μm is formed on the insulating layer 16, and at the same time a via contact 18b is formed inside the opening 28. As described above, a packaging board 50 as shown in FIG. 3B is manufactured by each step of the aforementioned process.

The exposed face of the conductor bump 20 in the packaging board 50 is roughened wherein the face thereof exposed by the above-described process corresponds to a joint between the conductive bump 20 and the first wiring layer 18. Hence, the adhesion to the first wiring layer 18 improves and therefore the displacement of the conductive bump 20 which may be caused when it is embedded in the insulating layer 16 can be suppressed. It is to be noted here that in the second process the opening 28 is formed from the other face of the insulating layer 16 in a manner that an arithmetic mean roughness Ra of the exposed face of the conductive bump 20, namely the face in contact with the first wiring layer 18, is 2 to 50 μm. As a result, the adhesion between the conductive bump 20 and the first wiring layer 18 further improves.

Next a description is given of the fourth process and the fifth process. The fourth process prepares a semiconductor substrate 12 where an electrode 14 serving as a second wiring layer is formed on the surface of the substrate. In the fifth process, the insulating layer 16 and the semiconductor substrate 12 are press-bonded together and thereby the conductive bump 20 is embedded into the insulating layer 16 while the conductive bump 20 formed on the first wiring layer 18 provided by the above-described third process is disposed counter to the electrode 14.

First, a predetermined electric circuit or a circuit element such as MOSFET (not shown) is formed by a known technique in a region near the surface S of the semiconductor substrate 12, which is for instance a p-type silicon substrate, and also an electrode 14 is formed by a known technology in the peripheral part or the upper part thereof. The electrode 14 is generally made of a metal such as aluminum. Then an insulating-type protective film 22 to protect the semiconductor substrate 12 is formed in a region on the surface S of the semiconductor substrate 12 such that a predetermined portion of the electrode 14 is exposed. The protective film 22 to be used may be a silicon dioxide film ($SiO_2$) or a silicon nitride film (SiN).

The thus manufactured semiconductor substrate 12 is prepared as shown in FIG. 4A, and the insulating layer 16 and the semiconductor substrate 12 are stacked in a state where the conductive bump 20 formed on the first wiring layer 18 and the electrode 14 are disposed counter to each other. Then, in this state, press-forming is performed using a press unit, so that, as shown in FIG. 4B, the conductive bump 20 is embedded into the insulating layer 16, thus uniting the semiconductor substrate 12, the conductive bump 20 and the insulating layer 16 into a single body (embedding process).

Here the pressure for the press-forming using the press unit is about 5 MPa, and the temperature therefor is about 200° C. As a result of this press-forming, the viscosity of the insulating layer 16 drops, and thus the insulating layer 16 develops plastic flow. Hence, the conductive bump 20, while it is in contact with the electrode 14, is embedded self-aligningly in the insulating layer 16. In this first embodiment, the thickness of the insulating layer 16 is about 80 µm and the height of the conductive bump 20 is about 20 µm, so that the conductive bump 20 is embedded by the press-forming into the insulating layer 16 without penetrating therethrough.

Immediately following the embedding of the conductive bump 20 in the insulating layer 16, a heat treatment (150° C. for 30 minutes) to the insulating layer 16 is performed to completely cure the insulating layer 16. As a result, the insulating layer 16 is press-bonded fixedly to the semiconductor substrate 12, and at the same time the conductive bump 20, while it is pressed against the electrode 14, is fixed within the insulating layer 16. In this manner, by the fourth process and the fifth process according to the first embodiment as illustrated in FIGS. 4A and 4B, the semiconductor substrate 12 and the insulating layer 16 can be press-bonded together while the electrode 14 and the conductive bump 20 are in contact with each other, and the conductive bump 20 can be embedded in the insulating layer 16.

Then, as illustrated in FIG. 1, a rewiring pattern 18a having predetermined line/space patterns is formed by processing the first wiring layer 18 by commonly known lithography and etching techniques. After this, the insulating layer 16 and the rewiring pattern 18a are covered by the solder resist layer 26 so that an opening is formed in an electrode pad forming area of the rewiring pattern 18a. The solder resist layer 26, which functions as a protective film for the rewiring pattern 18a, can be made of an epoxy resin or the like. The thickness of the solder resist layer 26 according to the first embodiment is about 40 µm, for instance. Then, the solder bump 24, which functions as an external connection terminal, is formed by a solder printing method in the part of the rewiring pattern 18a exposed through the opening in the solder resist layer 26.

As described above, the semiconductor module 10 as shown in FIG. 1 is manufactured by each step of the above-described process. By employing the method for manufacturing the semiconductor module according to the first embodiment, the conductive bump 20 is exposed from the other face of the insulating layer 16 before the insulating layer 16 is press-bonded to the semiconductor substrate 12 on which a circuit element is formed. Thus the circuit element is free from damage in the second process where laser is used. Also, by employing the method for manufacturing the semiconductor module according to the first embodiment, the conductive bump 20 is formed on one face of the insulating layer 16 and, at the same time, is exposed from the other face of the insulating layer 16. And the first wiring layer 18 is provided in a position where the conducive bump 20 is exposed, and the first wiring layer 18 is also provided on the other face of the insulating layer 16 via the via contact 18b. Accordingly, the conducive bump 20 is firmly fixed to the insulating layer 16 via the first wiring layer 18. As a result, when the conductive bump 20 is embedded in the insulating layer 16 by press-bonding the insulating layer 16 and the semiconductor substrate 12 in a state where the conductive bump 20 and the electrode 14 are disposed counter to each other, the conductive bump 20 is less likely to be displaced.

Also, by employing the method for manufacturing the semiconductor module according to the first embodiment, the conductive bump 20 is formed in the first process in such a manner that the height of the conductive bump 20 is smaller than the length of the conductive bump in the direction parallel to the surface of the insulating layer 16. If, for instance, the shape of the conductive bump 20 is circular, the length of the conductive bump 20 here may be its diameter. If, for instance, the shape of the conductive bump 20 is rectangular, the length of the conductive bump here may be the shorter side thereof. Hence, even if the force in the direction parallel to the surface of the insulating layer 16 is exerted upon the conductive bump 20 when the conductive bump 20 is embedded into the insulating layer 16, the conductive bump 20 will be less deformable. As a result, the positional error or misregistration of the conductive bump 20 can be suppressed.

Second Embodiment

Figure 6:
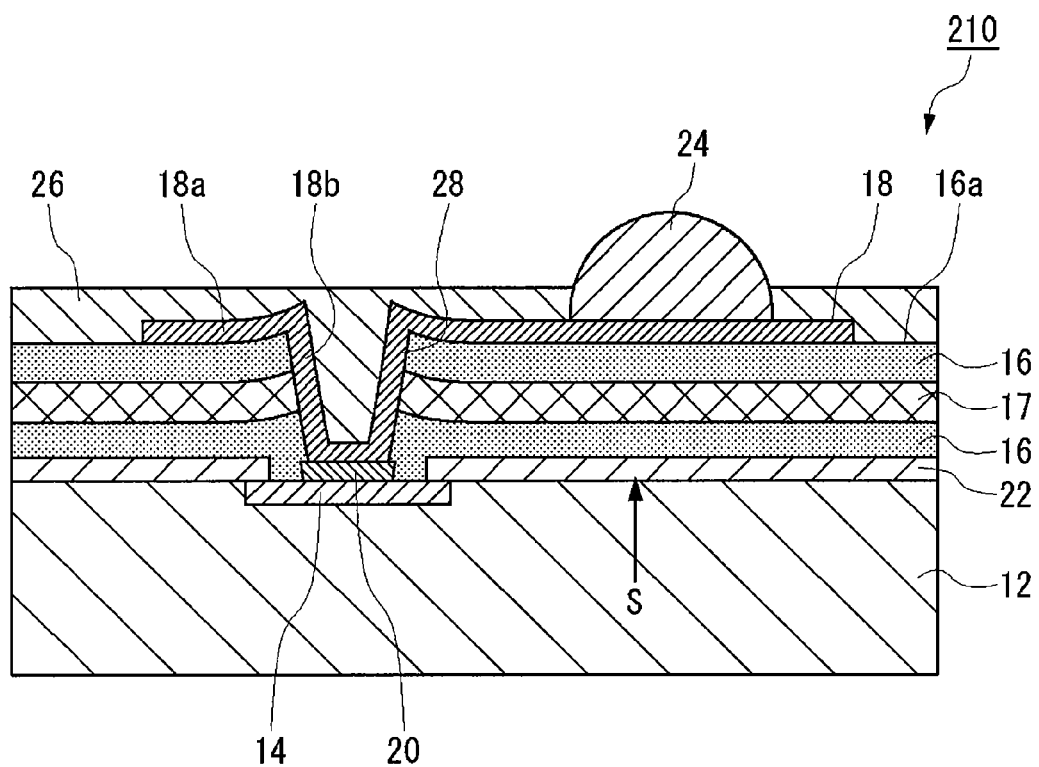
FIG. 6 is a schematic cross-sectional view illustrating a structure of a semiconductor module according to a second embodiment of the present invention.

FIG. 6 is a schematic cross-sectional view illustrating a structure of a semiconductor module according to a second embodiment of the present invention. In comparison with the semiconductor module 10 according to the first embodiment, a semiconductor module 210 according to the second embodiment differs greatly in that a glass fiber 17 is contained inside the insulting layer 16. In the following description, the description of the same features as those of the first embodiment will be omitted as appropriate.

The semiconductor module 210 according to the second embodiment includes a semiconductor substrate 12 with a predetermined electric circuit or a circuit element such as MOSFET (not shown) formed by a known technique on a surface S (upper-face side) thereof, an electrode 14 of the circuit element, which is part of a second wiring layer formed on the surface S (especially in the peripheral part) serving as a mounting face of the semiconductor substrate 12, an insulating layer 16 disposed on the electrode 14, a first wiring layer 18 disposed on the insulating layer 16, and a conductive bump 20 which serves as a conductor electrically connecting the electrode 14 to the first wiring layer 18 in a state where it is embedded with the insulating layer 16.

Formed on the face of the semiconductor substrate 12 is a protective film 22 in such a manner that it has a predetermined region exposing the electrode 14. To widen the pitch of adjacent electrodes 14, a rewiring pattern 18a is formed on the insulating layer 16 which is provided on the top of the electrode 14 and the protective film 22. Connection between the electrode 14 and the rewiring pattern 18a is made via the conductive bump 20 connected to the exposed surface of the electrode 14 and a via contact 18b connected to this conductive bump 20. Provided on a predetermined region of the rewiring pattern 18a is a solder bump 24, which serves as an external connection electrode, and the rewiring pattern 18a is covered by a solder resist layer 26 except in the region where the solder bump 24 is provided.

The insulating layer 16 includes therein the glass fiber 17 which is a fibrous filler material. The glass fibers 17 are disposed and oriented so that the direction of the fibers thereof intersects with the direction vertical to the surface of the semiconductor 12 (the thickness direction of the insulating layer 16). Use of the glass fiber 17 whose coefficient of thermal expansion is less than that of the insulating layer 16 can prevent the insulating layer 16 from being deformed when the thermal stress is caused by the heat generated at the time the semiconductor module 210 is activated. As a result, even though the coefficients of thermal expansion differ greatly in between the semiconductor substrate 12 and the insulating layer 16, the movement of the conductive bump 20 due to the deformation of the insulating layer 16 is suppressed, so that the connection reliability can be improved. It is preferable that the coefficient of thermal expansion of the glass fiber 17 is nearly equal to that of the semiconductor substrate 12.

More specifically, the insulating layer 16 including the glass fiber 17 therein is a membrane of such a type that a woven glass cloth is impregnated with resin (glass fibers where the fibers extending in a horizontal sheet surface direction intersect with those extending in a vertical sheet surface direction, for instance). And the insulating layer 16 is formed on the surface S (upper-face side), and the thickness thereof is about 80 μm, for instance. The glass fiber 17 is disposed parallel to the surface S of the semiconductor substrate 12 and provided in an approximately central part of the insulating layers 16. The thickness of the glass fiber 17 is about 20 μm, for instance.

By a manufacturing method discussed later, the glass fiber 17 is formed in such a manner that it is in contact with a side face of the via contact 18b constituting part of the first wiring layer 18 and it is curved toward the rewiring pattern 18a in the vicinity of a side face of the conductive bump 20. That is, as shown in FIG. 6, the glass fiber 17 placed parallel to the surface S of the semiconductor substrate 12 is deformed, in a projected manner, along with a penetration portion where the conductive bump 20 and the via contact 18b penetrate. In this manner, the glass fiber 17 is curved toward the other face 16a of the insulating layer 16 by the conductive bump 20 and the via contact 18b penetrating through the insulating layer 16. As a result, its restorative force works to press the conductive bump 20 against the electrode 14 to achieve adhesion therebetween. Hence, the connection reliability between the conductive bump 20 and the electrode 14 improves, thereby producing a low-resistance connection.

The via contact 18b penetrating through the insulating layer 16 also penetrates through the glass fiber 17 and therefore the via contact 18b becomes difficult to move. As a result, the connection reliability between the via contact 18b and the conductive bump 20 can be improved. If a material whose coefficient of thermal expansion is close to the coefficient of thermal expansion of silicon (Si) used generally for the semiconductor substrate 12 is selected as the glass fiber, the thermal stress generated due to the difference in the coefficients of thermal expansion between the insulating layer 16 and the semiconductor substrate 12 can be made smaller. Hence, the displacement of the conductive bump 20 can be suppressed.

(Manufacturing Method of Semiconductor Module)

Figure 7A:
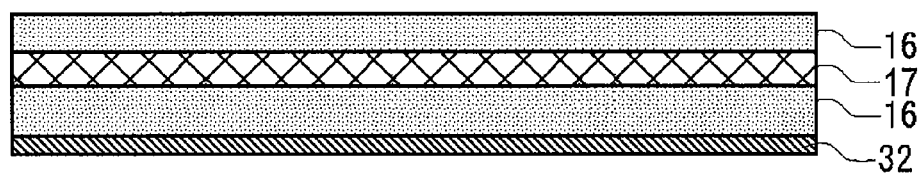
FIGS. 7A to 7C are schematic cross-sectional views for explaining a first process in a method for manufacturing a semiconductor module according to a second embodiment of the present invention.
Figure 7B:
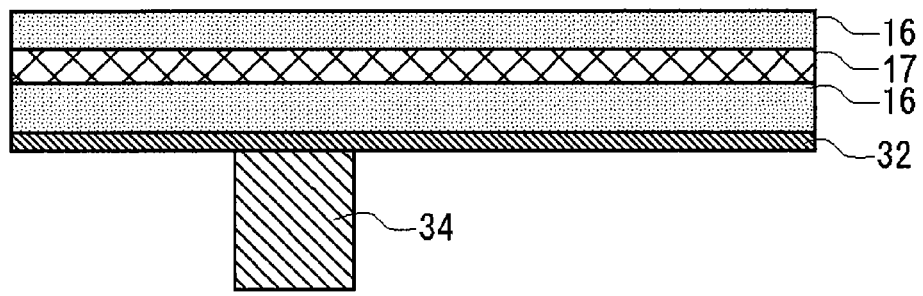
Figure 7C:
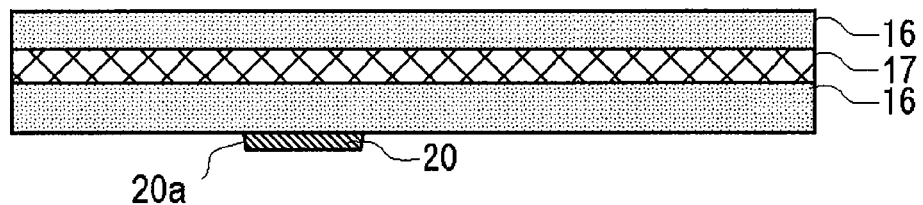
Figure 8A:
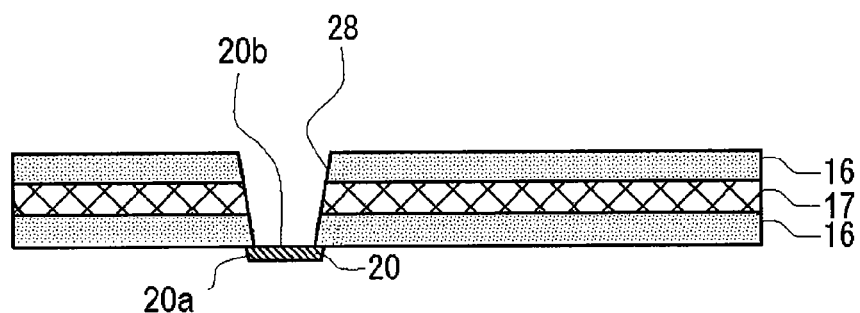
FIGS. 8A and 8B are schematic cross-sectional views for explaining a second process and a third process in a method for manufacturing a semiconductor module according to a second embodiment of the present invention.
Figure 8B:
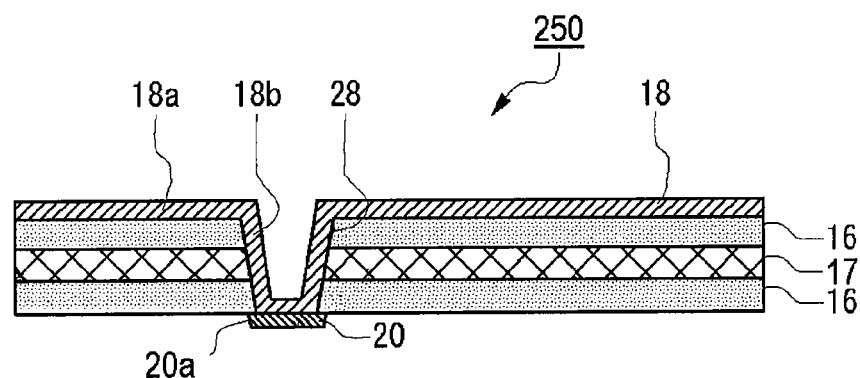
Figure 9A:
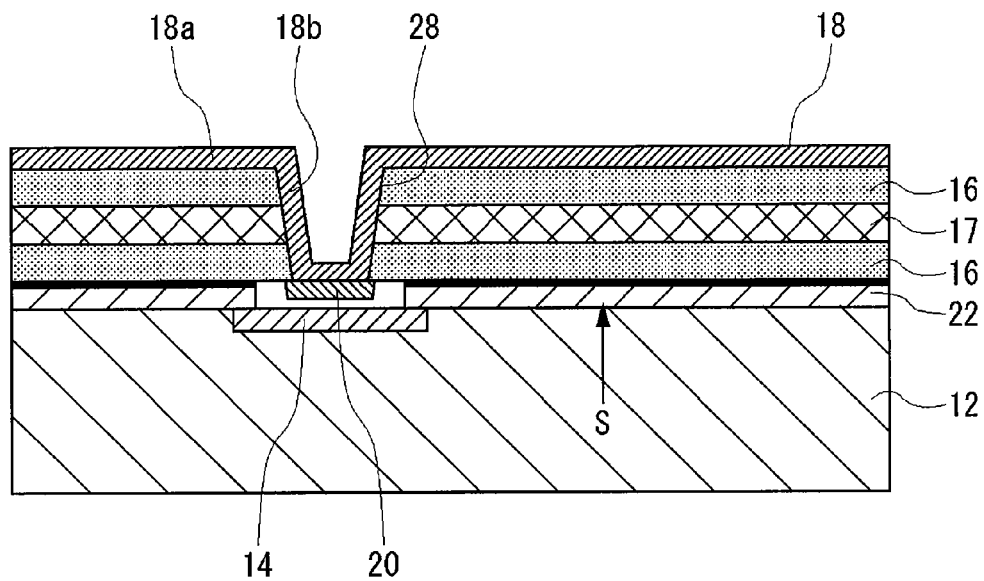
FIGS. 9A and 9B are schematic cross-sectional views for explaining a fourth process and a fifth process in a method for manufacturing a semiconductor module according to a second embodiment of the present invention.
Figure 9B:
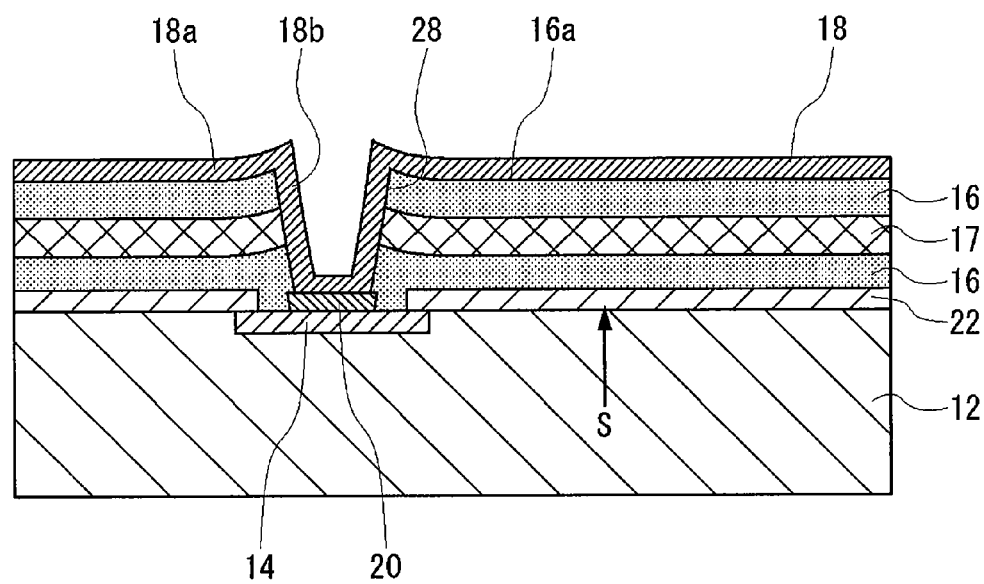

Now, referring to FIGS. 7A to 9B, a method for manufacturing a semiconductor module according to the second embodiment will be described. FIGS. 7A to 7C are schematic cross-sectional views for explaining a first process in the method for manufacturing a semiconductor module according to the second embodiment. FIGS. 8A and 8B are schematic cross-sectional views for explaining a second process and a third process in the method for manufacturing a semiconductor module according to the second embodiment. FIGS. 9A and 9B are schematic cross-sectional views for explaining a fourth process and a fifth process in the method for manufacturing a semiconductor module according to the second embodiment.

First, as shown in FIG. 7A, a copper layer 32 of about 10 μm thickness is formed on one face of an insulating layer 16 of about 80 μm thickness, which contains therein the glass fiber 17 of about 20 μm thickness and is made of an epoxy thermosetting resin, using an electroless plating and an electrolytic plating. Next, as shown in FIG. 7B, a resist mask 34 is formed in a conductive bump forming area on the copper layer 32, using an ordinary lithography method.

Now, as shown in FIG. 7C, a conductive bump 20 having a predetermined circular truncated cone shape is formed using the same method as in the first embodiment, and then the resist mask 34 is removed. Thus, by the first process according to the second embodiment as illustrated in FIGS. 7A to 7C, the conductive bump 20 can be formed on one face of the insulating layer 16.

Next, a description will be given of the second process, in which the conductive bump 20 is exposed from the other face of the insulating layer 16, and the third process, in which a first wiring layer 18 is formed on the exposed portion of the conductive bump 20 and on the other face of insulating layer 16.

As shown in FIG. 8A, an opening 28 is formed by laser irradiation from above the insulating layer 16 in a manner such that the conductive bump 20 is exposed. Here, the laser irradiation conditions are the same as those in the first embodiment. In this manner, by the second process (exposing process) according to the second embodiment as illustrated in FIG. 8A, the conductive bump 20 can be exposed from the other face of the insulating layer 16.

In the second process according to the second embodiment, as shown in FIG. 5, the exposing face of the conductive bump 20 is subjected to roughening when the conductive bump 20 is to be exposed from the other face of the insulating layer 16. Similar to the method employed in the first embodiment, the formation of the via hole and the roughening processing of the exposed face of the conductive bump 20 can be done in the same process. Hence, the manufacturing cost can be reduced.

Next, as shown in FIG. 8B, a plating of copper in the thickness of about 20 μm is performed on the upper face of the insulating layer 16 and on the inner face of the opening 28 including a position where the conductive bump 20 is exposed, using an electroless plating and an electrolytic plating, as the third process. As a result, a first wiring layer 18 comprised of a copper plating layer having a thickness of about 20 μm is formed on the insulating layer 16, and at the same time the via contact 18b is formed inside the opening 28. As described above, a packaging board 250 as shown in FIG. 8B is manufactured by each step of the aforementioned process.

The exposed face of the conductor bump 20 in the packaging board 250 is roughened wherein the face thereof exposed by the above-described process corresponds to a joint between the conductive bump 20 and the first wiring layer 18. Hence, the adhesion to the first wiring layer 18 improves and therefore the displacement of the conductive bump 20 which may be caused when it is embedded in the insulating layer 16 can be suppressed. It is to be noted here that in the second process the opening 28 is formed from the other face of the insulating layer 16 in a manner that the arithmetic mean roughness Ra of the exposed face of the conductive bump 20, namely the face in contact with the first wiring layer 18, is 2 to 50 μm. As a result, the adhesion between the conductive bump 20 and the first wiring layer 18 further improves.

Then, similar to the first embodiment, a semiconductor substrate 12 where the electrode 14 which is the second wiring layer is formed on the surface of the substrate is prepared as the fourth process. And, as shown in FIG. 9A, the insulating layer 16 and the semiconductor substrate 12 are stacked in a state where the conductive bump 20 formed on the first wiring layer 18 and the electrode 14 are disposed counter to each other. Then, in this state, press-forming is performed using the press unit, so that, as shown in FIG. 9B, the conductive bump 20 is embedded into the insulating layer 16, thus uniting the semiconductor substrate 12, the conductive bump 20 and the insulating layer 16 into a single body (fifth process). It is noted here that the press-forming condition is the same as that in the first embodiment.

At this time, the glass fiber 17 is deformed in a projected manner due to the force exerted from the insulating layer 16 which undergoes plastic flow. As a result, the glass fiber 17 is deformed into a projection-like shape in a region where the conductive bump 20 and the via contact 18b are formed. That is, the glass fiber 17 is curved toward the other face 16a of the insulating layer 16 in the vicinity of a side face of the via contact 18b.

Then, as illustrated in FIG. 6, a rewiring pattern 18a having predetermined line/space patterns is formed by processing the first wiring layer 18 by the commonly known lithography and etching techniques similar to the first embodiment. After this, the insulating layer 16 and the rewiring pattern 18a are covered by the solder resist layer 26 so that the opening is formed in an electrode pad forming area of the rewiring pattern 18a. Then, the solder bump 24, which functions as an external connection terminal, is formed by a solder printing method in the part of the rewiring pattern 18a exposed through the opening in the solder resist layer 26.

As described above, the semiconductor module 210 as shown in FIG. 6 is manufactured by each step of the above-described process. By employing the method for manufacturing the semiconductor module according to the second embodiment, the following advantageous effects are obtained in addition to those of the first embodiment. The glass fiber whose coefficient of thermal expansion is smaller than the coefficient of thermal expansion of the insulating layer 16 is contained in the insulating layer 16. Thus, the deformation of the insulating layer 16 caused when the thermal stress is applied to the semiconductor module can be prevented. As a result, even though the coefficients of thermal expansion differ greatly in between the semiconductor substrate 12 and the insulating layer 16, the movement of the conductive bump 20 due to the deformation of the insulating layer 16 is suppressed, so that a semiconductor module 210 with improved connection reliability can be manufactured. In this manner, the glass fiber 17 is curved toward the other face 16a of the insulating layer 16 on which the first wiring layer 18 is provided and therefore its restorative force works to press the conductive bump 20 against the electrode 14 via the via contact 18b to achieve adhesion therebetween. Hence, the connection reliability between the conductive bump 20 and the electrode 14 improves, thereby manufacturing a semiconductor module that achieves the low-resistance connection.

Third Embodiment

Next, a description will be given of a mobile apparatus (portable device) provided with the semiconductor module according to each of the above-described embodiments. The mobile apparatus presented as an example herein is a mobile phone, but it may be any electronic apparatus, such as a personal digital assistant (PDA), a digital video cameras (DVC) and a digital still camera (DSC).

Figure 10:
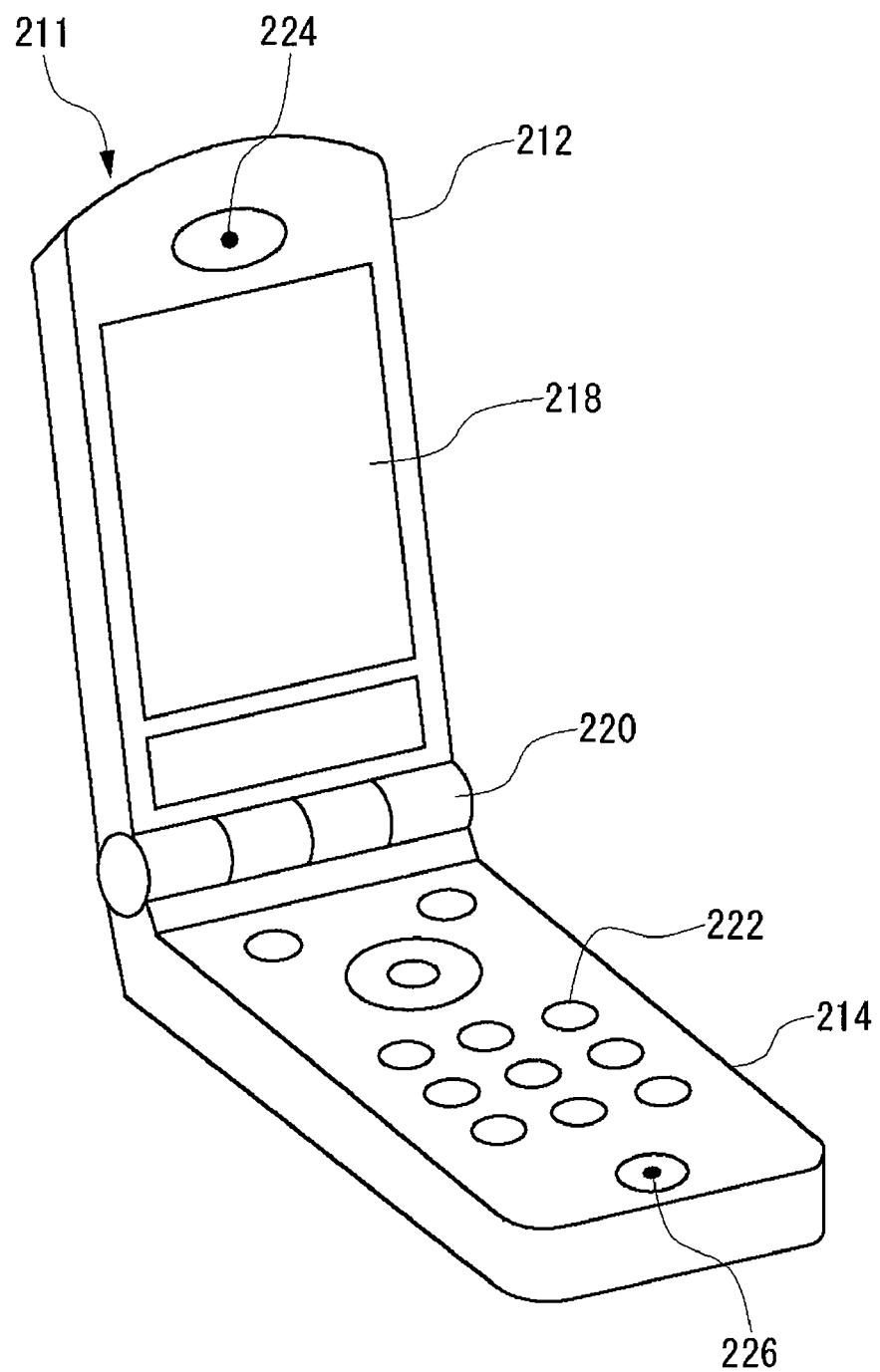
FIG. 10 illustrates a structure of a mobile phone according to a third embodiment of the present invention.

FIG. 10 illustrates a structure of a mobile phone provided with a semiconductor module according to each of the above-described embodiments. A mobile phone 211 has a structure including a first casing 212 and a second casing 214 jointed together by a movable part 220. The first casing 212 and the second casing 214 are turnable/rotatable around the movable part 220 as the axis. The first casing 212 is provided with a display unit 218 for displaying characters, images and other information and a speaker unit 224. The second casing 214 is provided with a control module 222 with operation buttons and the like and a microphone 226. Note that a semiconductor module according to each of the above-described embodiments is mounted within the mobile phone 211 such as this.

Figure 11:
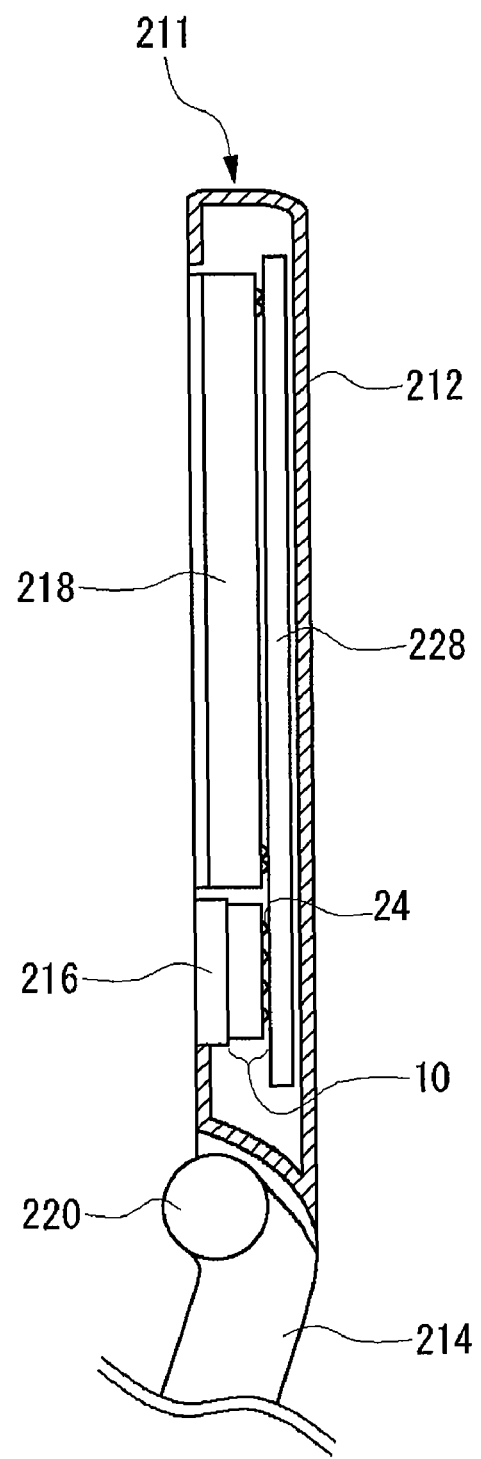
FIG. 11 is a partial cross-sectional view of a mobile phone shown in FIG. 10.

FIG. 11 is a partial cross-sectional view (cross-sectional view of the first casing 212) of the mobile phone shown in FIG. 10. A semiconductor module 10 according to each of the embodiments is mounted on a printed circuit board 228 via a solder bump 24, and is coupled electrically to a display unit 218 and the like by way of the printed circuit board 228. Also, a radiating substrate 216, such as a metal substrate, is provided on the back side of the semiconductor module 10 (opposite side of the solder bump 24), so that the heat generated from the semiconductor module, for example, can be efficiently released outside the first casing 212 without getting trapped inside the first casing 212.

The present invention has been described by referring to each of the above-described embodiments. However, the present invention is not limited to the above-described embodiments only, and those resulting from any combination of them or substitution as appropriate are also within the scope of the present invention. Also, it is understood that various modifications, such as the order in which a packaging board or a semiconductor module is manufactured being modified as appropriate and changes in design made in a packaging board or a semiconductor module based on the knowledge of those skilled in the art, and the embodiments added with such modifications are also within the scope of the present invention.

In the above-described embodiments, an example has been described in which the via contact 18b is provided in such a manner as to cover the inside of the opening 28. However, for example, the opening dimension of the opening 28 may be narrowed, and the via contact 18b may be formed such that the inside of the opening 28 can be completely filled with copper plating by adding a suppressor and an accelerator in the plating solution when the first wiring layer 18 including the via contact 18b is formed. This can produce a low-resistance via contact area (the conductive bump 20 and the via contact 18b).

Also, in the above-described embodiments, an example has been described in which a via contact area connecting the electrode 14 of the semiconductor substrate 12 to the rewiring pattern 18a thereof is provided. However, the via contact area can be applied to a connection between a lower wiring layer and an upper wiring layer within a multilayer wiring substrate, for instance. In such an arrangement, the production stability of the multilayer wiring substrate can be improved, and the multilayer wiring substrate can be manufactured at lower cost.

What is claimed is:

1. A semiconductor module, comprising:
   an insulating layer;
   a first wiring layer provided on said insulating layer;
   a substrate on which a circuit element is formed;
   a second wiring layer formed on a face of the substrate; and
   a conductor, embedded in said insulating layer, which electrically connects said first wiring layer to said second wiring layer and is connected to an electrode provided in the circuit element,
   wherein said conductor is such that an arithmetic mean roughness Ra of a face thereof in contact with said first wiring layer is 2 to 50 µm, and
   the insulating layer is in contact with the electrode of the circuit element.

2. A semiconductor module, comprising:
   an insulating layer which contains fibrous filler material whose coefficient of thermal expansion is smaller than that of said insulating layer, the fibrous filler material being arranged so that a direction of fibers thereof intersects with a thickness direction of said insulating layer;

a first wiring layer provided on said insulating layer;

a substrate on which a circuit element is formed;

a second wiring layer formed on a face of the substrate; and a conductor, embedded in said insulating layer, which electrically connects said first wiring layer to said second wiring layer and is connected to an electrode provided in the circuit element, wherein the fibrous filler material has a smaller coefficient of thermal expansion than that of said insulating layer, and the fibrous filler material is curved toward said first wiring layer in the vicinity of said conductor, and wherein said conductor is such that an arithmetic mean roughness Ra of a face thereof in contact with said first wiring layer is 2 to 50 µm, and the insulating layer is in contact with the electrode of the circuit element.

* * * * *